(12) United States Patent
Lenz

(10) Patent No.: US 6,389,677 B1
(45) Date of Patent: May 21, 2002

(54) PERIMETER WAFER LIFTING

(75) Inventor: Eric H. Lenz, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/944,255

(22) Filed: Aug. 30, 2001

Related U.S. Application Data

(62) Division of application No. 09/281,595, filed on Mar. 30, 1999.

(51) Int. Cl.$^7$ ................................................. B23Q 7/00
(52) U.S. Cl. .............................. 29/559; 269/13; 269/21; 451/388
(58) Field of Search ...................... 269/13, 21; 361/234, 361/233; 451/388; 29/559

(56) References Cited

U.S. PATENT DOCUMENTS

| | | |
|---|---|---|
| 5,324,012 A | 6/1994 | Aoyama et al. |
| 5,471,279 A | 11/1995 | Takizawa |
| 5,569,350 A | 10/1996 | Osada et al. |
| 5,677,824 A | 10/1997 | Harashima et al. |
| 5,923,408 A | 7/1999 | Takabayashi |
| 5,971,257 A | 10/1999 | Yang |
| 6,019,164 A | 2/2000 | Getchel |
| 6,056,825 A | 5/2000 | Sumnitsch |
| 6,305,677 B1 * | 10/2001 | Lenz ........................... 269/13 |

FOREIGN PATENT DOCUMENTS

| | | |
|---|---|---|
| EP | 0644578 | 3/1995 |
| EP | 0886298 | 12/1998 |
| JP | 0159744 | 6/1990 |

* cited by examiner

*Primary Examiner*—Joseph J. Hail, III
*Assistant Examiner*—Daniel Shanley
(74) *Attorney, Agent, or Firm*—Beyer Weaver & Thomas, LLP

(57) ABSTRACT

The invention relates to an apparatus for lifting a substrate from a surface of a chuck subsequent to a processing step. The apparatus includes a perimeter pin for lifting the substrate from the surface of the chuck to a first position wherein the substrate is disposed on the perimeter pin during lifting. The perimeter pin is configured to overcome a holding force at an interface of the substrate and the surface. Generally, the holding force is generated between the substrate and the surface during the processing step. The apparatus further includes a center pin for moving the substrate from the first position to a second position wherein the substrate is disposed on the center pin during moving. The second position is further away from the surface of the chuck than the first position.

15 Claims, 9 Drawing Sheets

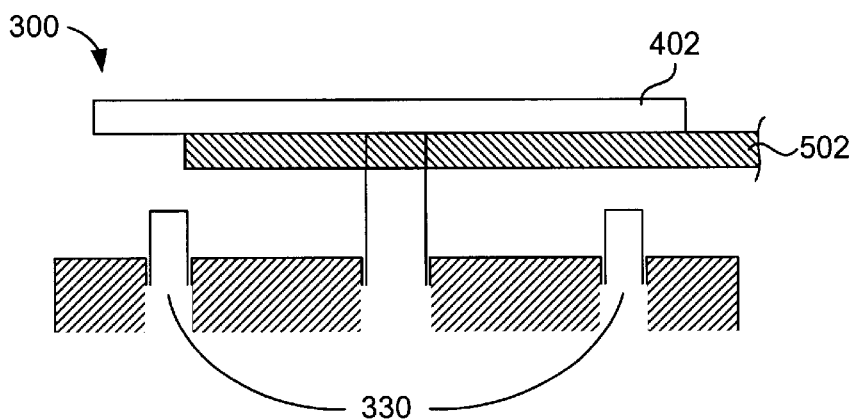
FIG. 5E
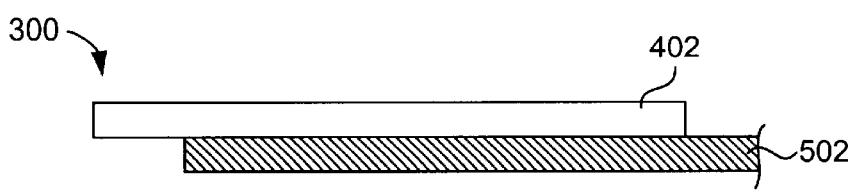
FIG. 5F
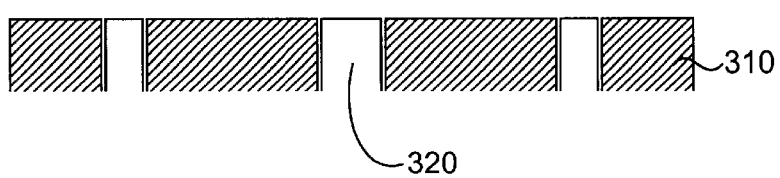
FIG. 5G
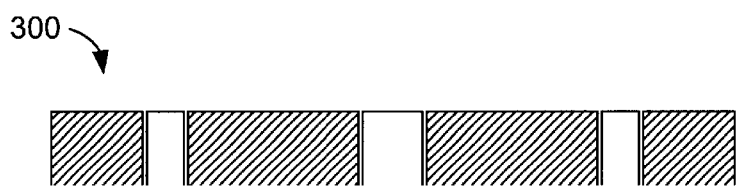
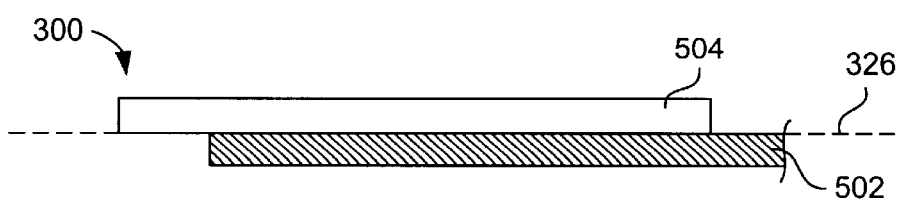
FIG. 5H

PERIMETER WAFER LIFTING

CROSS REFERENCE TO RELATED APPLICATION

This is a Divisional application of co-pending prior application Ser. No. 09/281,595 filed on Mar. 30, 1999, the disclosure of which is incorporated herein by reference.

BACKGROUND OF THE INVENTION

The present invention relates to the fabrication of semiconductor integrated circuits (IC's). More particularly, the present invention relates to an improved apparatus and method for lifting a substrate from the surface of a work piece holder subsequent to a processing step.

During the manufacture of a semiconductor-based product, for example, a flat panel display or an integrated circuit, many processing steps are employed. Broadly speaking, the manufacturing process involves placing a substrate into a process chamber, processing the substrate (e.g., etching or depositing) and removing the substrate from the process chamber.

It has been found that a sticking force is often times encountered between the substrate and the surface of a chuck that causes the substrate to stick to the surface of the chuck when the time comes to remove the substrate subsequent to the processing step. By way of example, a sticking force may be encountered when the chuck is used as an electrostatic device to hold a substrate during processing. To facilitate discussion of this problem, FIG. 1 depicts an exemplary prior art lifting arrangement 100. Lifting arrangement 100 includes a work piece holder 110 (e.g., a chuck) and a lifting pin 120. Work piece holder 110 is typically designed to hold substrate 130 during processing (e.g. electrostatically). Lifting pin 120, typically disposed through the middle of the chuck, is used to move substrate 130 from the surface of work piece holder 110 to a predefined height where substrate 130 may then be lifted off lifting pin 120 and removed from the process chamber. Typically, lifting pin 120 is placed in the center of work piece holder 110 to accommodate side-swinging transport arms that are used to remove the substrate from lifting pin 120.

Often times, an electrostatic force will be built up between the chuck (or work piece holder) and the substrate during substrate processing. This may arise because of a residual charge (e.g., due to uncompensated DC bias and/or charge accumulated on the chuck surface or on the substrate). Typically, the residual charge creates an electrostatic force, which will herein be referred to as a residual holding force, between the chuck and the substrate that tends to cause them to stick to one another.

Generally, the charge that creates the residual holding force may gradually be bled away from the chuck to reduce the residual holding force and allow the substrate to be lifted off the chuck by lifting pin 120. However, this method of lifting the substrate is time-consuming since a non-trivial time constant is typically involved, and thereby disadvantageously reducing the throughput of the plasma processing system (e.g., reducing the number of substrates that can be processed by a given plasma processing system per unit of time).

If the residual charge is inadequately bled, the use of the center pin to lift the substrate off the chuck often gives rise to other problems. By way of example, the substrate may be unbalanced on the center pin (as shown in FIG. 1) because a moment is created at the point of lift, which causes the substrate to tilt. Additionally, the substrate may wobble on the center pin as it is lifted, possibly causing the substrate to fall off the center pin or wander about the center pin so that the substrate is no longer aligned on the center pin.

The aforementioned problem of substrate tilting, wobbling or wandering may be addressed in part by employing perimeter pins to lift the substrate off the chuck. FIG. 2 shows a lifting arrangement 200 that uses perimeter pins to lift the substrate. Lifting arrangement 200 includes a chuck 210 and perimeter pins 220. Also included in FIG. 2 is a substrate 230. Since the pins are distributed about the perimeter of the substrate, the aforementioned wobbling or tilting problem is substantially eliminated. However, the perimeter pin arrangement is limited in that such an arrangement cannot be used in systems that employ swinging or arcing transport arms because the perimeter pins interfere with the movement of the transport arm (e.g., the transport arm cannot clear the perimeter pins).

In view of the foregoing, these are desired, improved methods and apparatuses for lifting a substrate off a surface of a chuck in a plasma processing system without inducing substrate tilting or wobbling or interfering with the movement of a transport arm.

SUMMARY OF THE INVENTION

The invention relates, in one embodiment, to an apparatus for lifting a substrate from a surface of a chuck subsequent to a processing step. The apparatus includes a perimeter pin for lifting the substrate from the surface of the chuck to a first position wherein the substrate is disposed on the perimeter pin during lifting. The perimeter pin is configured to overcome a holding force at an interface of the substrate and the surface. Generally, the holding force is generated between the substrate and the surface during the processing step. The apparatus further includes a center pin for moving the substrate from the first position to a second position wherein the substrate is disposed on the center pin during moving. The second position is further away from the surface of the chuck than the first position.

The invention relates, in another embodiment, to a substrate processing system. The system includes a work piece holder arrangement that is configured to remove a substrate from a surface of the work piece holder when the substrate is coupled to the surface of the work piece holder by a holding force. Further, the work piece holder includes a first pin configured to break the holding force between the substrate and the work piece holder by lifting the substrate from the surface to a first position. The substrate is disposed on the first pin during lifting. The work piece additionally includes a second pin for moving the substrate from the first position to a second position wherein the substrate is disposed on the second pin during moving. The second position is further away from the surface of the work piece holder than the first position.

The invention relates, in yet another embodiment, to a method of removing a substrate from a surface of a work piece holder in a substrate process chamber. The method includes producing a holding force between the substrate and the surface during processing. The method further includes breaking the holding force by lifting the substrate away from the surface to a first position, the lifting is accomplished by a first pin wherein the substrate is disposed on the first pin during breaking. Thereafter, the method additionally includes moving the substrate with a second pin from the first position to a second position. The second position is further away from the surface of the work piece holder than the first position.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 5a–5k show, in accordance with one embodiment of the present invention, the lifting mechanism and the multiple steps involved in overcoming the holding force and moving a substrate to a position for removal from the chamber.

DETAILED DESCRIPTION OF PREFERRED EMBODIMENTS

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one embodiment of the present invention, the perimeter pins and the center pins are used in combination to overcome the residual holding force and move the substrate to a position for removal from the chamber by a transport arm. The perimeter pins are used to overcome the residual holding force by lifting the substrate a small distance away from the surface of the chuck. In one embodiment, the distance moved by the perimeter pins is small enough to cause the residual charge to migrate off the substrate. In other words, the small lift allows the substrate to peel away from the chuck, and the positioning of the lifting points at the perimeter advantageously keeps the substrate from wobbling or tilting as it is being lifted. Subsequently, the center pins are employed to move the substrate to another position for substrate removal by the transport arm. Because the residual holding force has already been overcome, the center pins are now able to move the substrate without creating a moment that causes tilting or wobbling.

Figure 1:
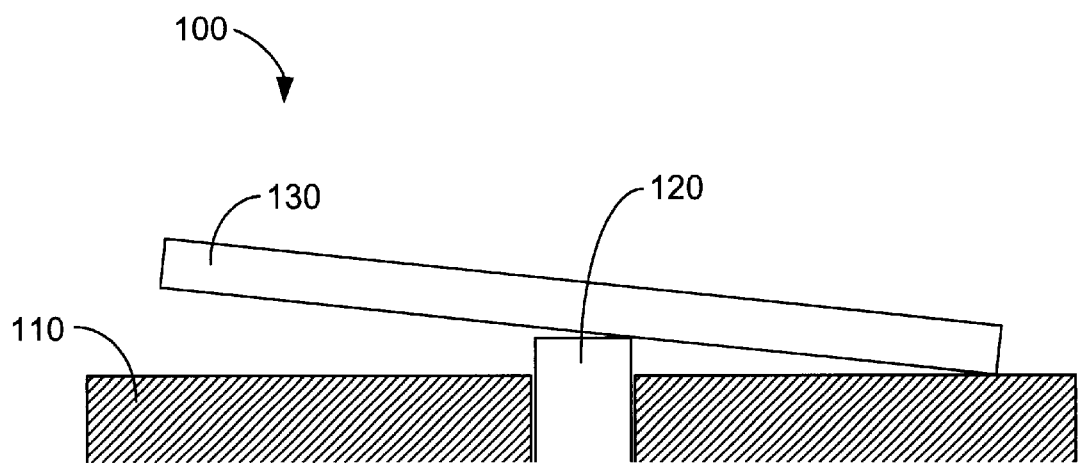
FIG. 1 depicts an exemplary lifting device with a sticking problem.
Figure 2:
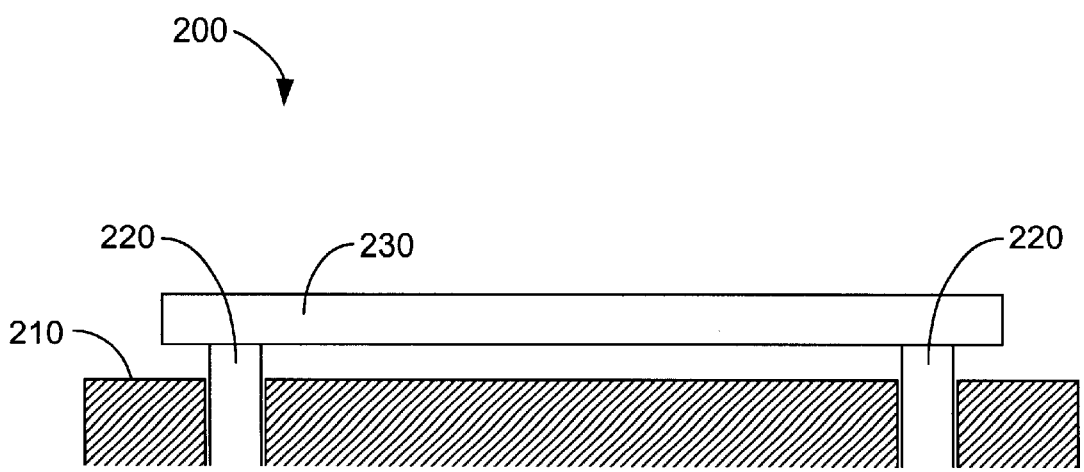
FIG. 2 shows a prior art lifting mechanism that uses perimeter pins to lift a substrate.
Figure 3A:
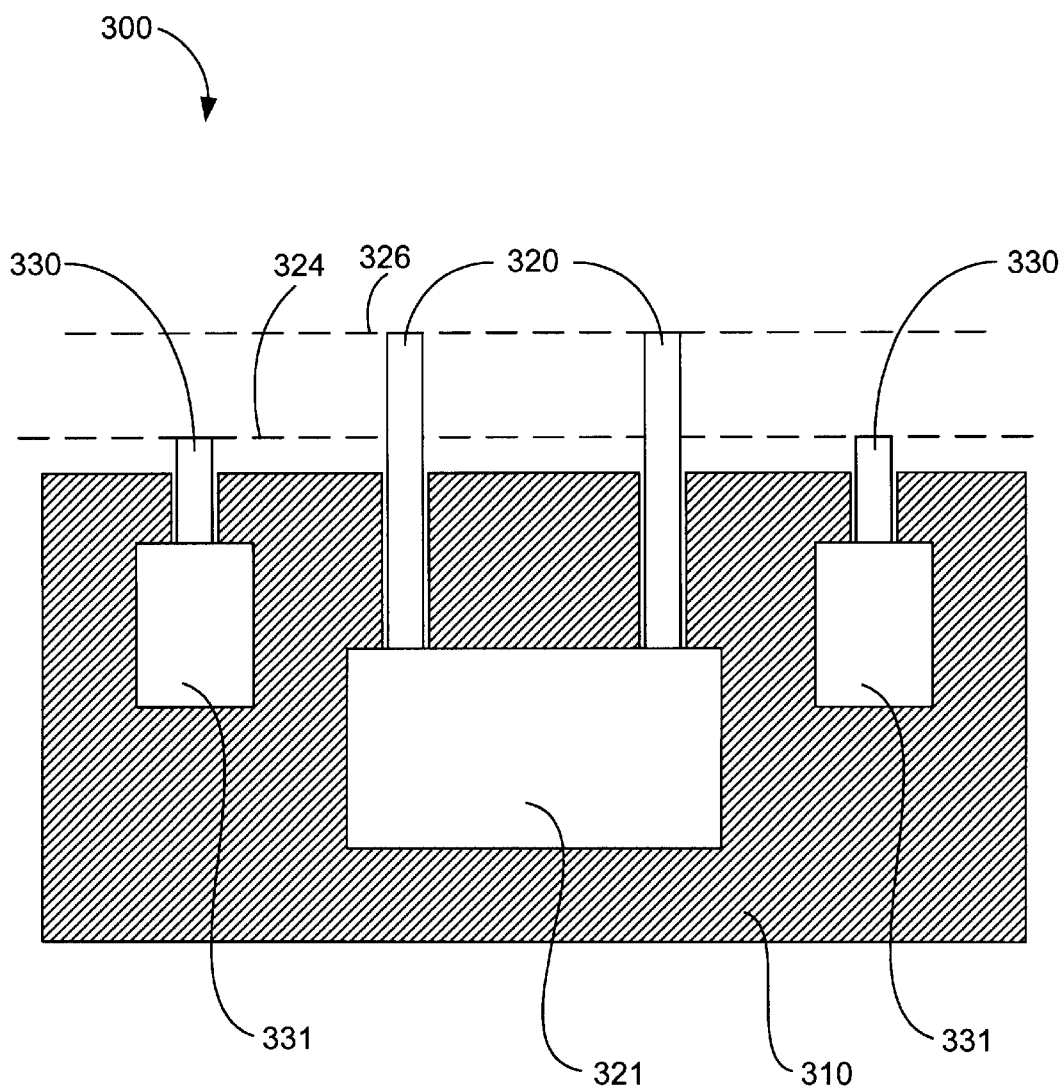
FIGS. 3a–3c depicts, in accordance with one embodiment of the present invention, a lifting mechanism that utilizes both a center pin and a perimeter pin to lift a substrate away from a chuck.

To facilitate discussion of this aspect of the present invention, FIG. 3a depicts a lifting arrangement 300 that utilizes both center pins and perimeter pins to lift a substrate away from a chuck. For ease of discussion, both the perimeter pins and center pins are shown in their fully up position. Lifting arrangement 300 includes a chuck 310, center pins 320 and perimeter pins 330. Perimeter pins 330 are coupled to perimeter pin actuators 331, and center pins 320 are coupled to a center pin actuator 321. Each perimeter pin actuator 331 is configured to lift a perimeter pin 330 to a first position 324. As mentioned, because perimeter pins 330 are distributed about the perimeter of the substrate, the wobbling or tilting problem is substantially eliminated as the substrate is lifted off the chuck surface.

Additionally, center pin actuator 321 is configured to move center pins 320 from first position 324 to a second position 326. Second position 326 represents a substrate removal position whereby a transport arm may engage the substrate and remove the substrate from the process chamber. Advantageously, since perimeter pins 330 are stopped at position 324, a transport arm may swing in and remove the substrate from position 326 without being blocked by the perimeter pins.

Figure 3B:
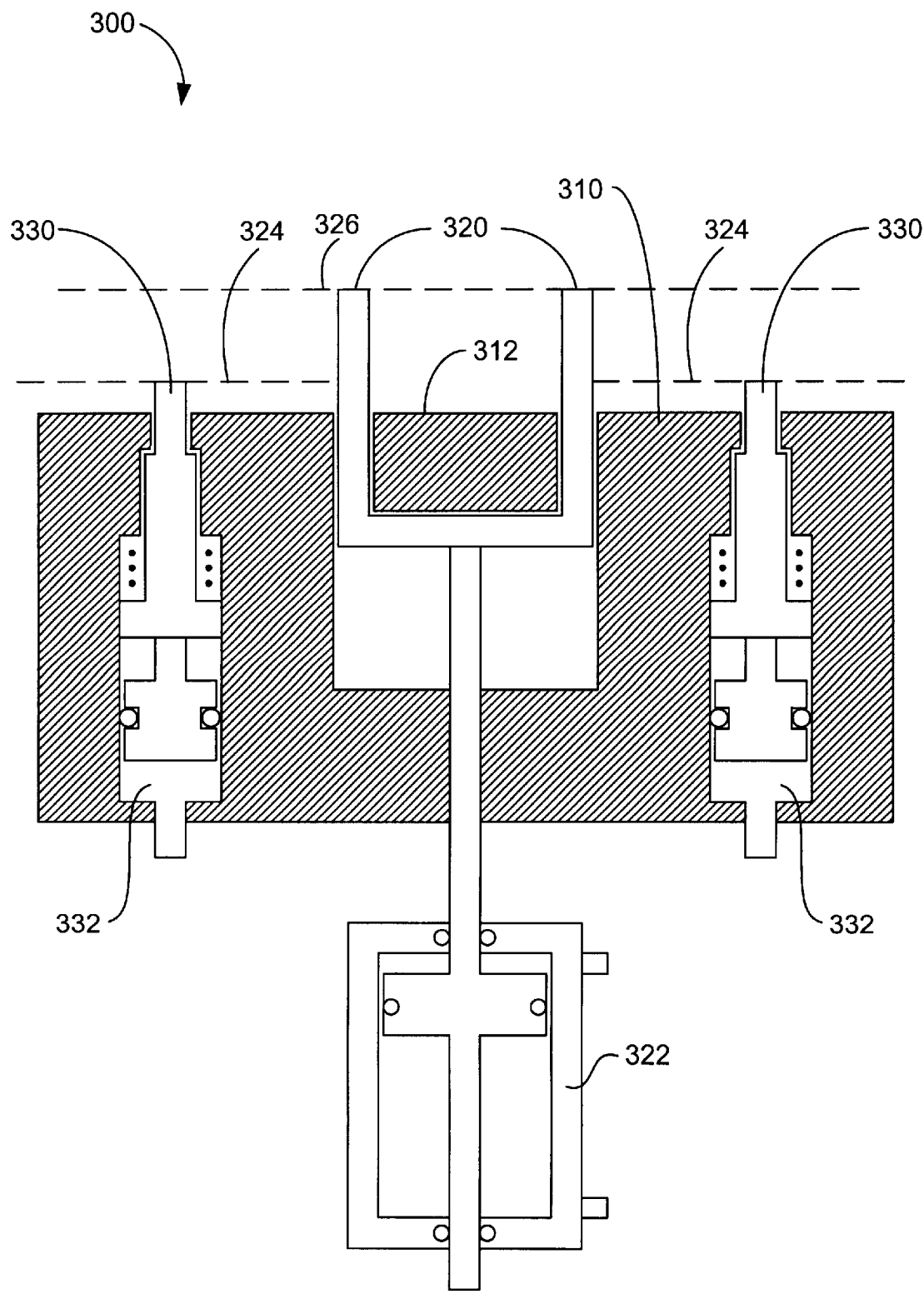

FIG. 3b illustrates a preferred embodiment of lifting arrangement 300. Lifting arrangement 300 includes chuck 310 having a top surface 312. Typically, chuck 310 is used to secure a substrate during processing. In some instances, chuck 310 is an electrostatic chuck, although it may be any chuck suitable for holding a substrate in place during processing (e.g., a mechanical chuck employing a mechanical clamp). Center pins 320 are disposed through chuck 310 and move in a direction perpendicular to surface 312. As is shown, center pins 320 are positioned proximate to the center of chuck 310. During processing, center pins 320 are contained inside chuck 310 in the down position that is at least even or below the bottom surface of a substrate.

Perimeter pins 330 are disposed through chuck 310 and move in a direction perpendicular to surface 312. As shown, perimeter pins 330 are positioned proximate to the perimeter of chuck 310. During processing, perimeter pins 330 are contained inside chuck 310 in the down position that is at least even or below the bottom surface of a substrate that is being processed.

Subsequent to processing, perimeter pins 330 are configured to lift a substrate from surface 312 to first position 324 in a direction away from surface 312. In general, the force applied by perimeter pins 330 is arranged to overcome any residual holding force that remains between a substrate and surface 312 after processing. In the exemplary FIG. 3b, each of perimeter pins 330 is powered by an air cylinder 332. Air cylinder 332 may be part of a perimeter pin 330 or an external mechanism that drives a perimeter pin 330. Preferably, an internal air cylinder is used because it is smaller and therefore requires less space. The internal air cylinder is an air cylinder that is internal to the perimeter pin arrangement. This aspect of the perimeter pin will be shown in more detail in FIG. 4. Alternatively, other types of actuators that are suitable for actuating perimeter pins 330 (e.g., screw, piezoelectric actuators, cams, gears, etc) may also be employed. The perimeter pins may be driven by a single actuator or each perimeter pin may be driven by its own actuator. The perimeter pins are configured to lift the substrate to a first position 324.

Center pins 320 engage the substrate at first position 324 and move the substrate to second position 326. Generally, second position 326 is determined by design constraints associated with substrate transfer from center pins 320 by a transport arm (not shown). Additionally, if needed, the center pins may be configured to move in multiple steps, each step having a different position. Preferably, center pins 320 are powered by an air cylinder 322 that pushes the pins upward in tandem to reduce the possibility of substrate tilting or wobbling. Preferably, air power is used because such an actuator is not electrically conductive. However, this is not a limitation and therefore other types of actuators that are suitable for lifting center pins 320 (e.g., screw, piezo-electric actuators, cams, gears, etc) may be used. Again, the center pins may be driven up by a single actuator (as shown in FIG. 3b, for example) or each center pin may be driven by its own actuator.

Figure 3C:
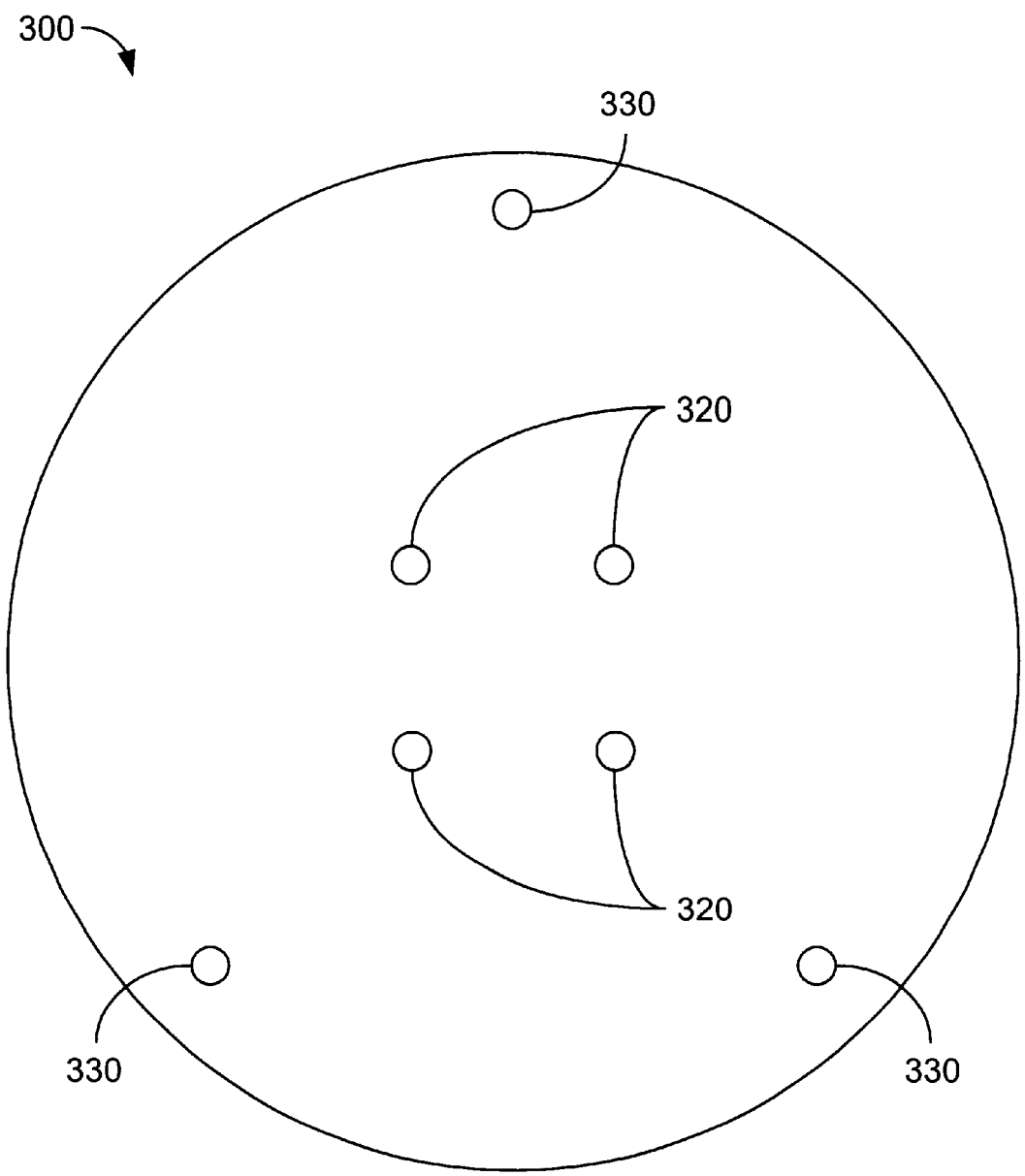

Referring to FIG. 3c, a top view of lifting mechanism 300 is shown. As is shown, center pins 320 includes four pins. The four pins are configured to move the substrate orthogonal to its center of gravity thereby keeping the substrate balanced. Preferably, each pin of the four pin arrangement of center pins 320 is spaced in rectangular fashion about 1 inch apart along a diameter of about 1.414 inches. However, it should be noted that the center pin geometry is not limited to a four pin arrangement and any arrangement suitable for moving a substrate, while keeping it balanced, may be used. By way of example, three pins may be employed as the center pins if desired.

Furthermore, perimeter pins 330 may include three perimeter pins. As is well known in the art, three points define a plane and therefore it is preferable to have three pins lifting at the perimeter. Three pins tend to eliminate the rocking and bouncing associated with other multiple pin arrangements. This includes situations where one pin lifts before another pin lifts. Preferably, each pin is spaced an equal distance apart from one another along the chuck perimeter. However, it should be noted that perimeter pins 330 is not limited to three pins and any arrangement of pins that lifts the substrate substantially parallel to the surface of the chuck may be used.

Figure 4:
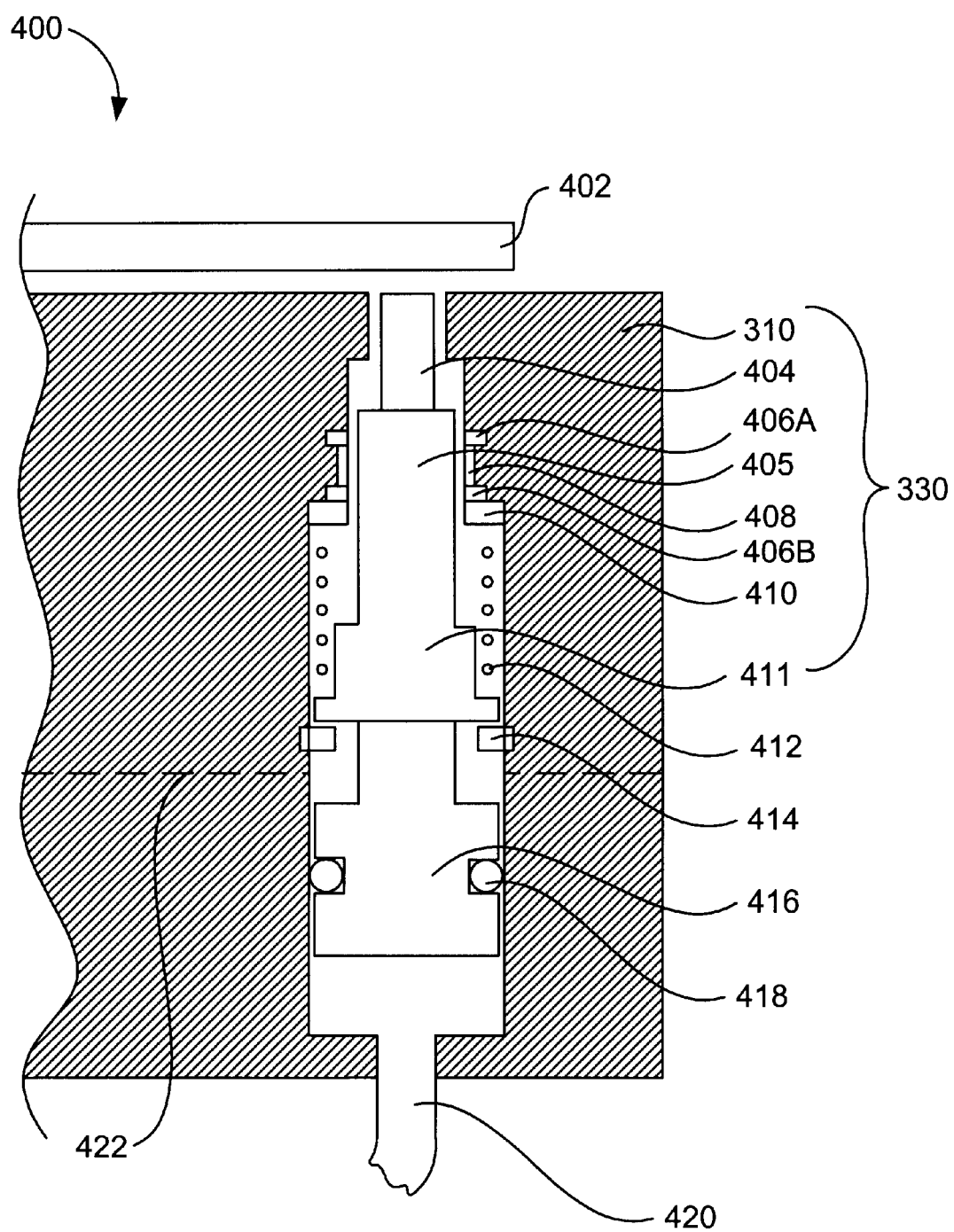
FIG. 4 depicts, in accordance with one embodiment of the present invention, a detailed schematic of the perimeter pin.

FIG. 4 illustrates, in one embodiment, a detailed schematic of a perimeter pin 330 that is used to lift a substrate 402. Perimeter pin 330 includes a pin end 404 representing the substrate contacting portion of perimeter pin 330 that drives upward to overcome the holding force. In some instances, pin end 404 is formed from Nitinol by Nitinol Device and Components of Fremont, Calif. However, it should be stated that pin end 404 may be formed from any material that is substantially resistant to a plasma within the chamber and/or does not contribute substantially to contamination. Generally, first pin end 404 tends not to have much wear because the substrate protects it from the plasma and the area above it is typically flooded with helium during processing. In this manner, perimeter pins 330 are protected from the plasma environment and the polymerization that may occur during substrate processing. Perimeter pin 330 maybe placed as close as possible to the edge of substrate 402. In one exemplary implementation, perimeter pin 330 is placed about 4 mm inside the substrate edge. However, this is not a limitation and perimeter pins 330 may be alternatively or additionally disposed at other locations proximate the substrate and/or chuck perimeter.

Perimeter pin 330 also includes a middle portion 405 that travels through a pair of seals 406a and 406b. It should be noted that the invention is not limited to a pair of seals and any sealing method that can substantially seal the perimeter pin may be used (e.g., bellows). A spacer 408 and packed grease are held in between seals 406a and 406b. A washer 410 is configured to hold the seals 406a and 406b in place and also acts as the up stop for a second pin end 411 of perimeter pin 330. Middle portion 405 and second pin end 411 maybe made of polyetheretherketone (PEEK). However, it should be stated that middle portion 405 or second pin end 411 may be formed from any suitable material, including materials that are substantially resistant to an electrical charge and/or are substantially frictionless. In between second pin end 411 and washer 410 is a spring 412 that bears on washer 410. Spring 412 biases perimeter pin 330 down to a snap ring 414. Snap ring 414 also acts as the down stop for perimeter pins 330. Perimeter pins 330 are driven by an internal air cylinder that includes a piston 416 and a piston seal 418. Piston 416 is configured to contact second pin end 411. An air source 420 couples the internal air cylinder to an air power source, which drives piston 416 upward when air is supplied thereby lifting perimeter pins 330. Also shown in FIG. 4, an optional split line 422 that represents a portion of chuck 310 that may be optionally removed when assembling perimeter pins 330 inside of chuck 310.

In one embodiment, the height of the first position (e.g., 324 in FIG. 3a) is determined by the distance needed to clear the substrate from the surface of the chuck to overcome the holding force. The height of the first position should be sufficient to allow at least some of the residual charge that creates the holding force to migrate off the substrate. In fact, as the perimeter pins lift to the first position, the charges at the perimeter tend to migrate to the center of the substrate (at this point the center of the substrate is closer to the surface of the chuck). Correspondingly, the capacitance of the residual charge is decreased and the resulting voltage at the center is increased (assuming the amount of charge is constant). Furthermore, the higher voltage at the center creates a larger driving voltage that tends to drive the charge off the substrate faster.

Additionally, the height of the first position is determined in view of the movement of a transport arm subsequently used to load or unload a substrate. The transport arm movement creates a design constraint problem and therefore the height of the first position should be set at least slightly below the lowest portion of the transport arm. One particular height that works well is about 0.04 inches from the surface of the chuck to the bottom surface of the substrate. However, it should be stated that there exists a plethora of substrate processing systems and each system may require a slightly different height. Also, for substrate transport it is typically necessary to lift the substrate much higher than the first position and therefore the second position is set further away from the surface of the chuck than the first position. Typically, the second height is determined by the location of the transport arm and other considerations associated with substrate transport.

In another embodiment, the perimeter pins are configured to lift the substrate a small distance before the center pins make contact with the substrate to lift the substrate to the position for removal. This is to ensure that the holding force is overcome before center pin/substrate engagement. In some instances, the perimeter pin will lift up for about ½ a second, enough time to get a substantial amount of charge to migrate of the substrate. After the perimeter pins have broken the holding force between the substrate and surface, the center pins move to engage the substrate. The perimeter pins will remain at or below the first position when the center pins move the substrate to the second position for subsequent substrate removal.

Figure 5A:
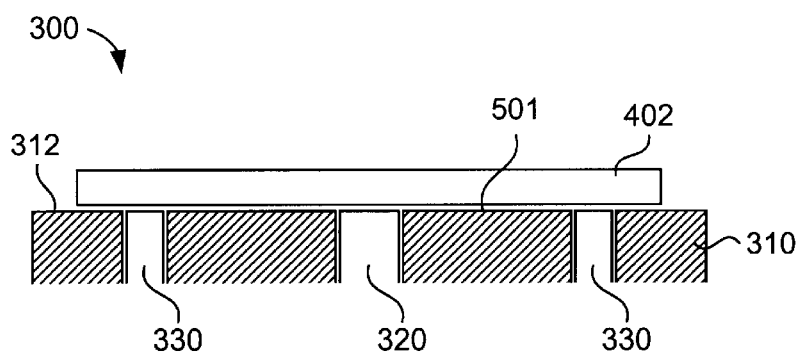

To facilitate discussion of this aspect of the invention, FIGS. 5a–5k show lifting mechanism 300 and the multiple steps involved in overcoming the holding force and moving a substrate to the position for subsequent substrate removal. FIG. 5a depicts lifting mechanism 300 subsequent to processing steps such as etching, depositing or the like. During this time substrate 402 is de-clamped from chuck 310. De-clamping may include mechanical or electrical disengagement (e.g., removal of vacuum, removal of mechanical clamp, removal of clamping voltage and/or voltage reversal) . As mentioned, a residual holding force 501 is produced between substrate 402 and surface 312 of chuck 310 during processing. Also shown are perimeter pins 330 and center pins 320 in the down position below substrate 402. At this point, lifting mechanism 300 is ready for lifting.

Figure 5B:
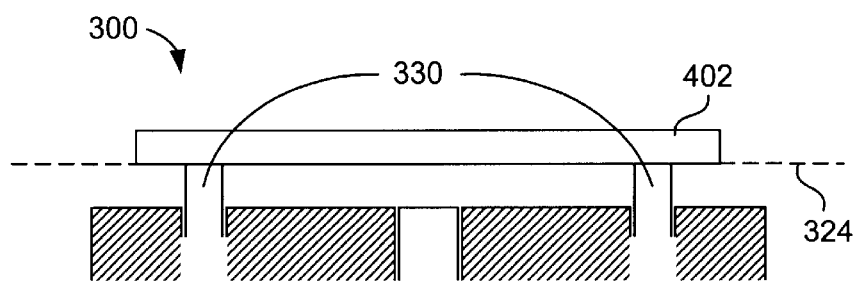
Figure 5C:
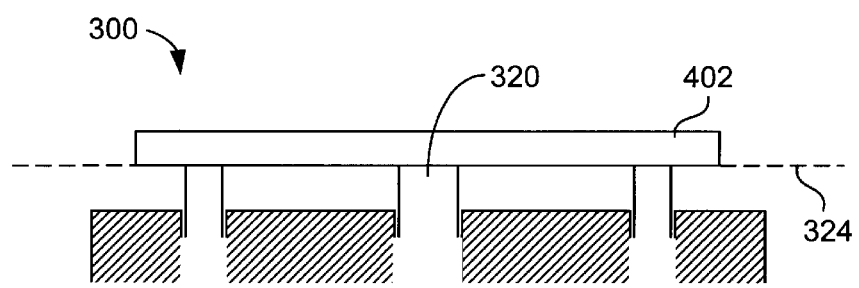
Figure 5D:
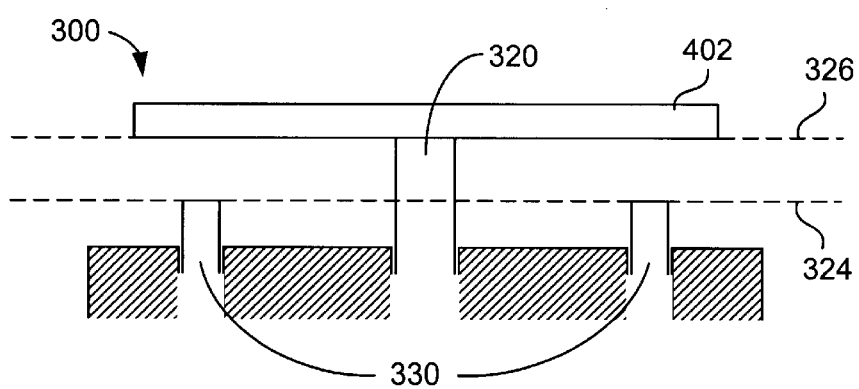

FIG. 5b illustrates perimeter pins 330 lifting substrate 402 to first position 324. As mentioned, lifting by the perimeter pins overcomes residual holding force 501 (shown in FIG. 5a), while keeping substrate 402 balanced on perimeter pins 330. Subsequent to lifting by the perimeter pins, center pins 320 move to engage substrate 402 at first position 324, as shown in FIG. 5c. It should be noted that center pins 320 may begin to move before perimeter pins 330 reach first position 324. However, it is preferable for perimeter pins 330 to reach first position 324 before center pins 320. It is also possible for center pin 320 to engage substrate 402 before substrate 402 reaches the first position 324. As is shown in FIG. 5d, following engagement, center pins 320 move substrate 402 to second position 326. It should be borne in mind that engagement of substrate 402 and moving of substrate 402 by center pins 320 may be completed in one step. Also, perimeter pins 330 may stay at first position 324 when center pins 320 move to second position 326, although it is not required (i.e., they may be retracted).

At this point, substrate 402 is ready to be removed from center pins 320. As is seen in FIG. 5e, a transport arm 502 moves into a transfer position to accept substrate 402. In some instances, transport arm 502 will rotate across and above perimeter pins 330. As discussed, perimeter pins 330 are preferably disposed below the plane of the transport arm. As shown in FIG. 5f, once transport arm 502 is in position to accept substrate 402, center pins 320 retract, at least partially, to their initial position inside of chuck 310, leaving substrate 402 on transport arm 502. However, it is possible to configure transport arm to clear center pins 320 during substrate movement, thereby obviating the need to retract center pins 320 prior to substrate removal. Transport arm 502 then moves substrate 402 to a load or unload station (not shown), leaving lifting mechanism 300 ready for a new substrate, as depicted in FIG. 5g. In some situations, a pair of transport arms are used, one for loading substrates on the chuck and one for unloading substrates from the center pins. These two arms may operate from opposite directions working correspondingly. A new substrate 504 is selected, and transport arm 502 moves new substrate 504 into second position 326 just above chuck 310, as seen in FIG. 5h.

Figure 5I:
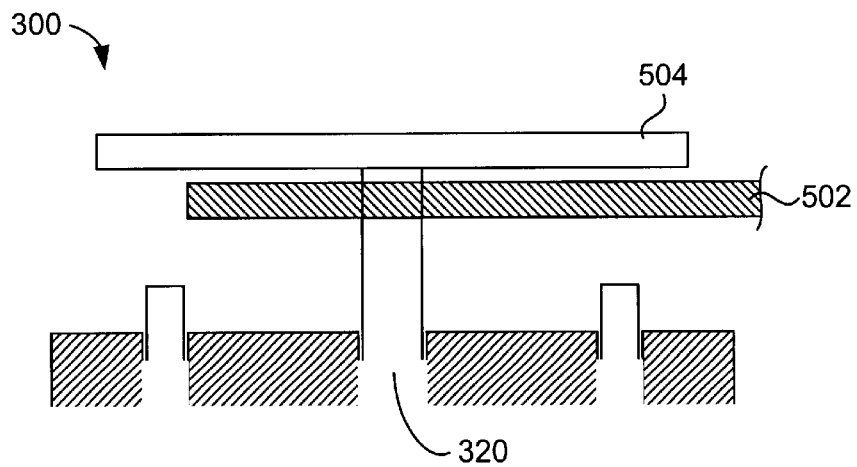
Figure 5J:
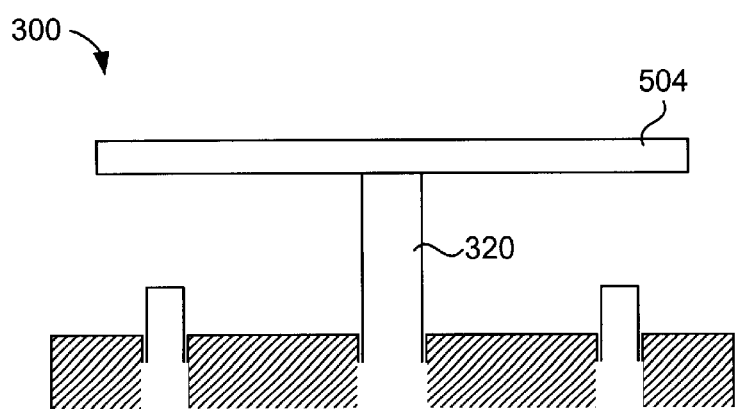
Figure 5K:
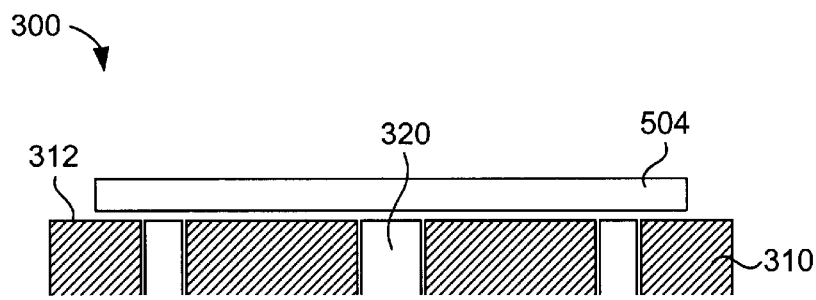

Center pins 320 then move up and engage new substrate 504 and lift it just above transport arm 502, as shown in FIG. 5i. Alternatively, new substrate 504 may be lowered by transport arm 502 onto the waiting center pins. In FIG. 5j, transport arm 502 moves away, leaving new substrate 504 on center pins 320. At this point, center pins 320 slowly lower new substrate 504 to surface 312 of chuck 310, as depicted in FIG. 5k. Chuck 310 then clamps new substrate 504 to hold it in place during processing. Clamping may include engaging new substrate 504 mechanically or electrically (e.g., turning on voltage of electrostatic chuck). After clamping, new substrate 504 is ready for substrate processing. It should be noted that although the center pins and the perimeter pins may be configured to move upward at separate times, they may move together to lift the substrate off the surface of the chuck, in one embodiment. The perimeter pins may then retract to leave the center pin to support the substrate at the position suitable for removal from the chamber.

In most instances, the center pin and perimeter pin movements would be controlled separately. However, in a preferred embodiment of the present invention, the movements of lifter arrangement 300 are controlled with a single air supply arrangement. In this embodiment, air that is supplied to the air cylinder of the center pins for powering its movement is partially split away to power the air cylinders of the perimeter pins. Through the use of valves and flow controllers that are coupled to the center pin air cylinder, the timing sequence of the pins, as shown in FIG. 5, may be realized. Moreover, because the perimeter pin lift is small, the perimeter pins may function without the use of flow controllers and therefore the size of the perimeter pin arrangement may be small. Advantageously, a smaller perimeter pin arrangement makes it possible to retrofit old machines that may have limited space for accommodating pins at the perimeter.

Figure 6:
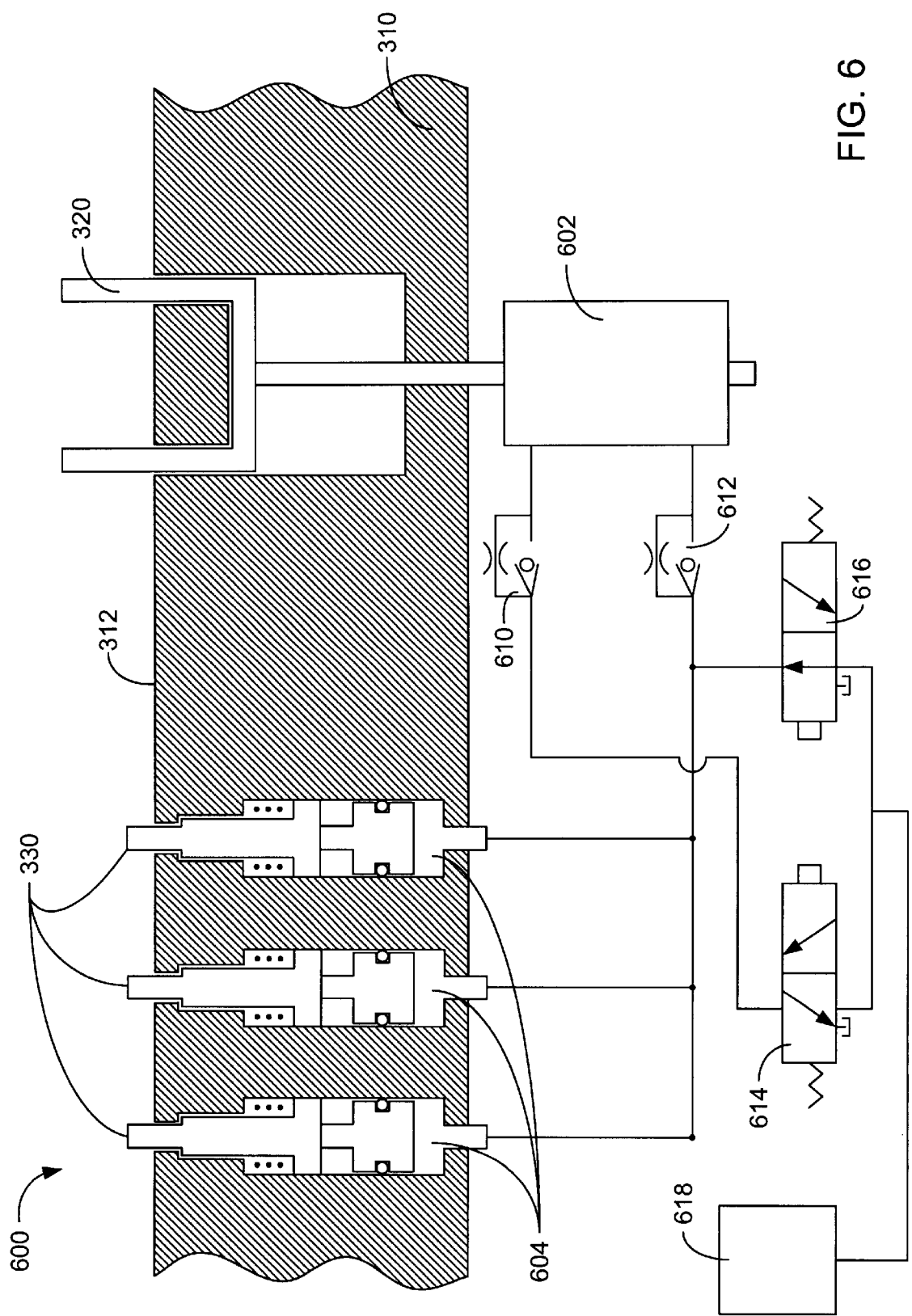
FIG. 6 depicts, in accordance with one embodiment of the present invention, lifting mechanism 300 with a single air source arrangement.

To facilitate this aspect of the present invention, FIG. 6 depicts lifting mechanism 300 with a single air supply arrangement 600. Lifting mechanism 300 includes perimeter pins 330 and center pins 320 contained in chuck 310. For ease of discussion perimeter pins 330 are shown grouped together, although under most circumstances will be arranged around the chuck perimeter, as discussed earlier.

Single air supply arrangement 600 includes an air cylinder 602 for driving the movements of the center pins 320 and an internal air cylinder 604 that is included in each perimeter pin (as shown in FIG. 4) for driving the movements of perimeter pins 330. Air cylinder 602 includes a first flow controller 610 and a second flow controller 612. First flow controller 610 is configured to drive air cylinder 602 vertically down when supplied with air. Second flow controller 612 is configured to drive air cylinder 602 vertically up when supplied with air. First flow controller 610 is coupled through an air line to a first valve 614 and second flow controller 612 is coupled through an air line to a second valve 616. Both valves are coupled through an air line to an air supply 618 that directs air to each valve. Basically, the valves are switches that are arranged to control the direction of air. Additionally, both valves are electrically operated by a controller (not shown) such as a computer. As shown, internal air cylinders 604 are coupled through an air line to second valve 616.

In order to activate the upward movements of the lifting arrangement, the controller actuates second valve 616, which sends air to second flow controller 612 and internal air cylinders 604. Correspondingly, internal air cylinders 604 drive perimeter pins 330 to the first position. At this point in time, air cylinder 602 does not move because first valve 614 is not venting. As soon as first valve 614 is actuated to vent (by the controller), air cylinder 602 can drive center pins 320 to the second position. As is well known in the art, a balanced air cylinder, which has air supply at its inlet cannot move until the outlet is allowed to vent. Additionally, it should be noted that single air supply arrangement 600 is shown with second valve 616 open and second valve 614 venting because the arrangement is shown in the up position.

Furthermore, in order to reverse the movements as described above, second valve 616 is closed and actuated to vent by the controller. Subsequently, perimeter pins 330 will move down because of the spring bias (as shown in FIG. 4) and the venting of second valve 616. At the same time, first valve 614 is actuated by the controller to supply air to first flow controller 610. Because second valve 616 is already venting, the air at first flow controller 610 will tend to drive air cylinder 602 down and therefore center pins 320, as well. It should be noted that the aforementioned arrangement is not limiting and is only one way to implement the movements of the lifting arrangement of the present invention.

As can be seen from the foregoing, the present invention offers numerous advantages over the prior art. By way of example, the invention substantially eliminates substrate throwing, wobbling, and wandering associated with prior art substrate removal techniques. Correspondingly, this decreases damage to the substrate, the transport arm, the chuck, the pins and/or the chamber. Further, the inventive technique improves substrate throughput by reducing the amount of time that is normally required to bleed the residual charge from the substrate. By way of example, it is now possible to substantially reduce substrate to substrate cycle time by about 10 to 20 seconds. Further, the invention for substrate removal permits the use of swinging or arcing transport arms for substrate removal.

Additionally, the invention, because of the center pin and perimeter pin combination, provides the option of using different sized substrates. By way of example, in cases where a smaller substrate is used, the center pins may be enough to overcome the residual holding force and be sufficiently spaced apart relative to the smaller substrate such that substrate tilting and/or wobbling is not a significant problem. In this case, the same lifting arrangement may be employed for larger substrates (which makes use of the perimeter pins for initial lifting) and smaller substrates (which do not require the use of the perimeter pins and are not harmed by the presence thereof). Furthermore, the invention gives the option of retrofitting older machines because the perimeter pins are much smaller and may fit into areas that typically have space limitations. The perimeter pins are smaller than previous perimeter pins because the inventive perimeter pins of the present invention are powered by the same air supply as the center pins and therefore do not require flow controls and in most instances include an internal air cylinder that eliminates the need for a large external air cylinder.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method of removing a substrate from a surface of a work piece holder in a substrate process chamber, said method comprising:

producing a holding force between said substrate and said surface during processing;

breaking said holding force by lifting said substrate away from said surface to a first position, said lifting being accomplished by a first pin wherein said substrate is disposed on said first pin during said breaking; and thereafter, moving said substrate with a second pin from said first position to a second position, said second position being further away from said surface of said work piece holder than said first position.

2. The method of claim 1 wherein said first pin is proximate to the perimeter of said substrate.

3. The method of claim 2 wherein said first pin is contained under said substrate during said lifting.

4. The method of claim 1 wherein said second pin is proximate to the center of said substrate.

5. The method of claim 1 wherein said first pin and said second pin move in a direction perpendicular to said surface.

6. The method of claim 1 wherein said holding force is due to a residual static charge on said substrate.

7. The method of claim 1 wherein said work piece holder is an electrostatic chuck.

8. The method of claim 7 wherein said lifting from said surface to said first position is sufficient to clear said substrate from said surface of said chuck to break the electrostatic holding force on said surface.

9. The method of claim 1 wherein said first pin represents three pins employed to lift said substrate to said first position.

10. The method of claim 1 wherein said lifting of said substrate by said first pin is before said moving of said substrate by said second pin.

11. The method of claim 1 wherein said first pin and said second pin are powered by air.

12. The method of claim 1 wherein said first pin and second pin are powered by the same power source.

13. The method of claim 1 wherein said first pins are away from a movement path of a transfer arm employed to remove said substrate from said chamber when said substrate is disposed in said second position.

14. The method of claim 1 wherein said substrate is not in contact with said first pin during a portion of said moving.

15. The method of claim 1 wherein said first pin remains at or below said first position when said second pin moves said substrate from said first position to said second position.

* * * * *